(12) United States Patent
Spinar et al.

(10) Patent No.: US 8,860,449 B2
(45) Date of Patent: Oct. 14, 2014

(54) DUAL PROBING TIP SYSTEM

(75) Inventors: James E. Spinar, Clackamas, OR (US); Richard R. Lynn, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 341 days.

(21) Appl. No.: 13/487,069

(22) Filed: Jun. 1, 2012

(65) Prior Publication Data

US 2012/0313658 A1 Dec. 13, 2012

Related U.S. Application Data

(60) Provisional application No. 61/495,647, filed on Jun. 10, 2011.

(51) Int. Cl.
*G01R 1/067* (2006.01)
*G01R 1/073* (2006.01)

(52) U.S. Cl.
CPC ........ *G01R 1/06788* (2013.01); *G01R 1/06705* (2013.01); *G01R 1/07364* (2013.01); *G01R 1/07392* (2013.01)
USPC ............ 324/755.01; 324/755.02; 324/755.03; 324/755.04; 324/755.05

(58) Field of Classification Search
USPC ...................... 324/72.5, 754.01–754.11, 761, 324/755.01–755.05
See application file for complete search history.

(56) References Cited

U.S. PATENT DOCUMENTS

| | | | |
|---|---|---|---|
| 6,191,594 B1 * | 2/2001 | Nightingale et al. | 324/754.08 |
| 6,196,594 B1 * | 3/2001 | Keller | 283/82 |
| 6,276,956 B1 | 8/2001 | Cook | |
| 6,400,167 B1 * | 6/2002 | Gessford et al. | 324/755.05 |
| 6,404,215 B1 | 6/2002 | Nightingale et al. | |
| 6,828,768 B2 | 12/2004 | McTigue | |
| 6,967,473 B1 | 11/2005 | Reed et al. | |
| 7,102,370 B2 | 9/2006 | Cannon et al. | |
| 7,167,011 B2 | 1/2007 | Yang | |
| 7,212,018 B2 | 5/2007 | Annichiarico et al. | |
| 7,592,822 B2 * | 9/2009 | Reed et al. | 324/755.11 |
| 2009/0009200 A1 * | 1/2009 | Nielsen et al. | 324/758 |

* cited by examiner

*Primary Examiner* — Arleen M Vazquez
*Assistant Examiner* — Alesa Allgood
(74) *Attorney, Agent, or Firm* — William K. Bucher; Marger Johnson & McCollom, PC

(57) ABSTRACT

A dual probing tip system uses a slot and rail system to provide variable spacing and lateral and axial compliance of the probing tips mounted on first and second support members. A movable base member is secured on a frame with the base member having a rack of linear teeth and a pair of rails angled toward the front. First and second intermediate carriers each have a slot that engages one of the angled rails. Each of the carriers has stanchions that receive a thumb wheel pinion gear mounted on a shaft. The pinion gear mates with the teeth on the base member for movement of the carriers. Each support member has an axial slot that mated with an axial slot on each one of the carriers. Each support member has a compression spring which allows axial compliance of the support members.

12 Claims, 3 Drawing Sheets

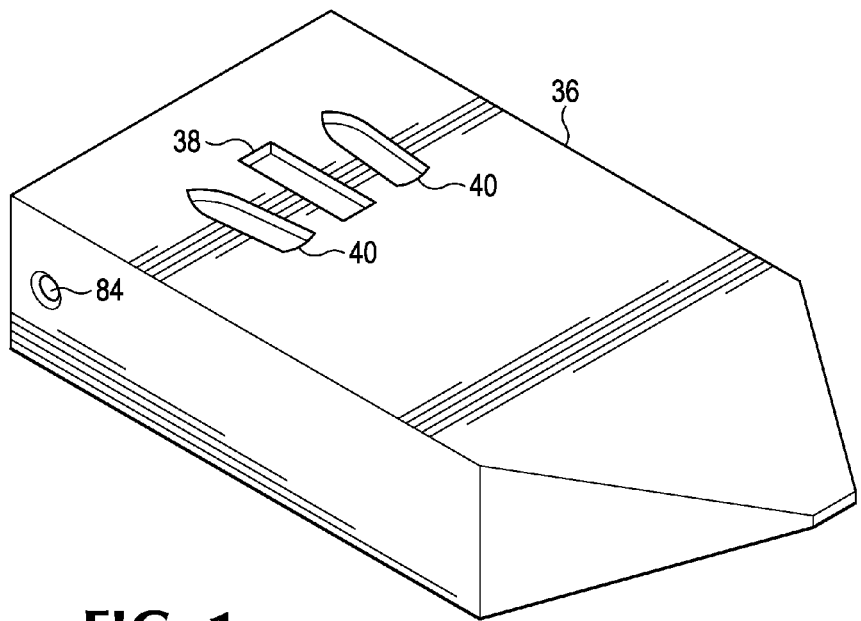
FIG. 1
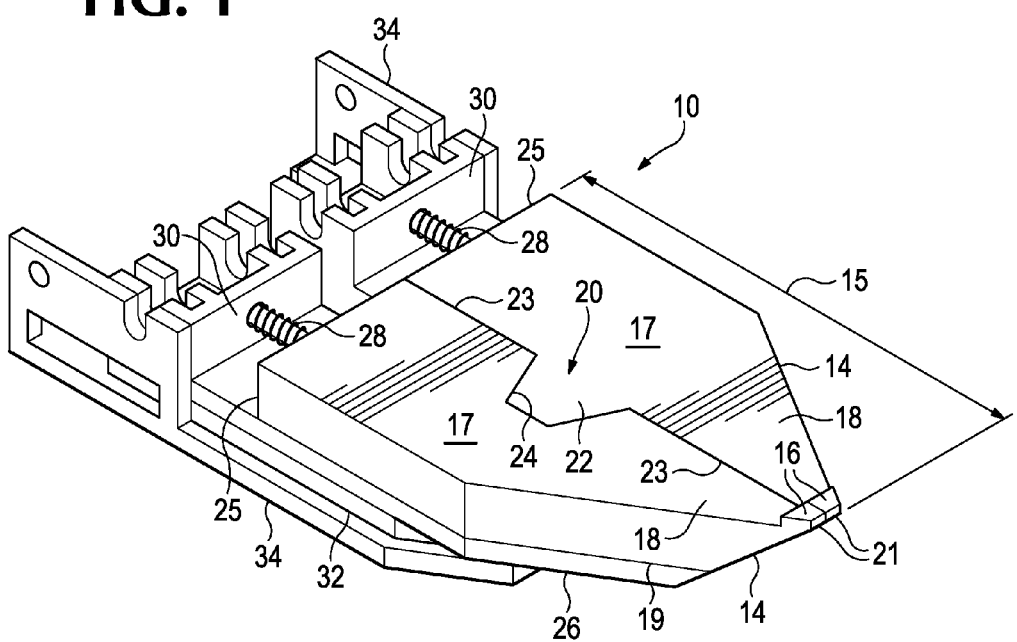

DUAL PROBING TIP SYSTEM

CROSS-REFERENCE TO RELATED APPLICATIONS

This application claims the benefit of priority of U.S. Provisional Application No. 61/495,647, filed Jun. 10, 2011 and incorporates by reference herein the contents of U.S. Provisional Application No. 61/495,647 as if such contents were set forth in full herein.

BACKGROUND OF THE INVENTION

Dual probe tip signal acquisition probes, such as differential probes and single ended probes with a ground contact, are used in the electronic industry for measuring electrical signals from a device under test. The probing tips generally require variable spacing to connect with probing contacts having different pitch spacing. Early variable pitch probes off-set the probing tips from the probing tip axis so as to rotate the probing tips around the probing tip axis to vary the spacing of the probing tips. Probing tips of this type are describes in U.S. Pat. Nos. 6,400,167 B1, 6,404,215 B1, 6,603,297 and 6,828,768.B1 Generally, theses type of probing tips required a user to manually adjust each of the probing tips separately.

An improved dual probe tip signal acquisition probe system uses a thumb wheel attached to dual probing arms. A probing tip is attached to one end of each probing arm with the other ends of the probing arms secured to a pivot point. The thumb wheel is generally positioned midway between the pivot point and probing tips. The thumb wheel is attached to the probing arms in such a way that rotational movement of the thumb wheel in the clockwise or counter-clockwise direction causes the probing arms to rotate or pivot around the pivot point to vary the spacing between the probing tips. Examples of such probing tip systems are described in U.S. Pat. Nos. 6,276,956 B1, 6,967,473 B1, 7,212,018 B1 and 7,592,822 B1.

In the above dual probe signal acquisition probes, each probing tip scribes an arc as it is rotates about its pivot point. Another dual probing tip acquisition probe system laterally moves one or more probing tips to decrease or increase the spacing of the probing tips. U.S. Pat. No. 7,167,011 describes a variable spacing probing system having one or more probing tip displacement mechanisms disposed adjacent to one or both probing tips. The probing tips are formed at the end of semi-rigid coaxial cables with each semi-rigid coaxial cable secured in a retention block. One or both of the retention blocks are connected to an adjustment mechanism having a carrier receiving the retention block. The probe body into which the semi-rigid coaxial cables are mounted has at least one threaded aperture extending from the side of the probe body into which is secured a threaded cap screw. A user uses a hex-key wrench, screwdriver or the like to rotate the cap screw clockwise or counter-clockwise to decrease or increase the separation of the probing tips.

Another requirement for dual probe tip signal acquisition probes is probe tip compliance. Probing points on a circuit under test may not be at the same height. The probing tips should be able to compensate for these variations by axial movement of the probing tips. Compression springs, non-compressive set elastomer or the like have been used to provide axial movement of the probing tips. U.S. Pat. Nos. 6,828, 768 B1, 7,102,370 B1, 7,167,011 B1 and 7,592,822 B1 describe various dual probing tip systems having probe tip compliance.

Dual probing tip signal acquisition probes should also provide lateral compliance as well as axial compliance. The most reliable connection to probing contacts on a device under test is when the probe is positioned normal to the probing contacts. However, this is not always the case. The probing tips need some amount of lateral compliance to compensate for the non-vertical positioning of the signal acquisition probe.

SUMMARY OF THE INVENTION

A dual probing tip system has a frame, a base member, first and second intermediate carriers, and first and second support members that cooperate to provide variable spacing and axial compliance of probing tips mounted on the support members. The base member is movably mounted on the frame with the base member having first and second rails formed on a top surface with the rails angularly disposed relative to a long axis toward the front end. The first and second intermediate carriers each have a bottom surface and a top surface with the bottom surface having a slot formed therein angularly disposed relative to a long axis toward the front end. Each slot of one of the first and second intermediate carrier mates with one of the first and second angularly disposed rails of the base member such that movement of the moveable base member in one direction causes the distance between the first and second intermediate members to close and movement in the other direction causes the distance between the first and second intermediate members to open. Each of the first and second intermediate carriers has a rail formed on the top surface thereof parallel to the long axis. Each of the first and second support members has a long axis, bottom surface and a top surface with the bottom surface having a slot formed therein parallel to the long axis for mating with one of the rails on the top surface of one of the first and second intermediate carriers.

Each of the first and second intermediate carriers has a plurality of spaced apart slotted stanchions disposed at the back end. One slotted stanchion extends from one side surface of the intermediate carrier and another slotted stanchion extends from an opposing side surface of the intermediate carrier. A transverse wall is disposed toward the front end and is connected to the plurality of slotted stanchions. A thumb wheel having teeth on the outer surface thereof forming a pinion gear is disposed on a shaft that is positioned in the slotted stanchions of the first and second intermediate carriers. The teeth of the pinion gear mate with a rack of linear teeth disposed on the base member parallel the long axis of the base member.

The frame has side rails extending from a front rail with the side rails terminating at an open end. Each side rail has an upright wall extending therefrom at the open end and a hole there through for receiving an attachment member. The attachment member, such as threaded screw, press fit pin or the like, is secured to a cover disposed over the dual probing tip system. A slot formed in each upright wall of the frame that extends downward from a top surface is coextensive with one of the slotted stanchions of the first and second intermediate carriers. A base member keeper is attached to the base member to capture the frame between the keeper and the base member.

Each of the first and second support members has an associated compression spring disposed between the back end of the support member and the transverse wall of one of the first and second intermediate carriers. A mounting element, such as a threaded screw, a press fit pin or the like, passes through a bore in the transverse wall and the compression spring and is secured to the support member. Each of the first and second support members has a long side parallel to its long axis with the first and second support member having an interlocking compliance mechanism. The interlocking compliance mechanism has a tab extending outward from the long side of one of the first and second support members and a corresponding recess extending inward from the long side of the other of the first and second support members. The tab and recess are trapezoidal in shape and engage each other as the distance between the first and second support members is decreased.

The objects, advantages and novel features of the present invention are apparent from the following detailed description when read in conjunction with appended claims and attached drawings.

DESCRIPTION OF THE DRAWINGS

FIG. 1 is a perspective view of a dual probing tip system according to the present invention.

DESCRIPTION OF THE INVENTION

Figure 2A:
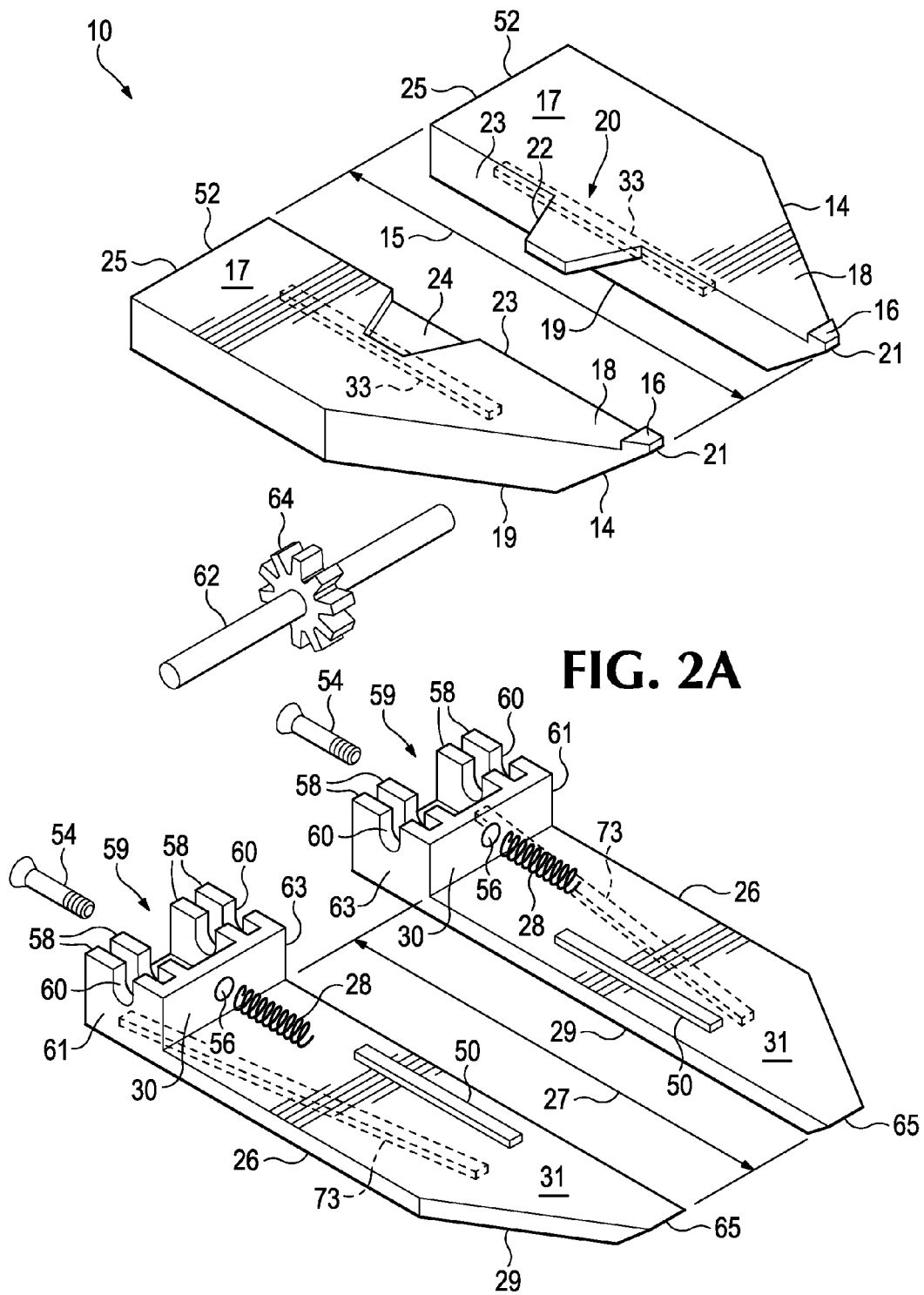
FIGS. 2A and 2B are exploded a perspective views of a dual probing tip system according to the present invention.

FIG. 1 shows a perspective view of a dual probing tip system 10 that is usable with a signal acquisition probe. The dual probing tip system 10 has first and second substantially triangular shaped support members 14 having a long axis 15. The support member 14 has top and bottom surfaces 17 and 19 with the top surface having a raised pedestal region 16 at the front end 21 and an adjacent recessed region 18. The support member 14 is constructed of a low dielectric, high strength non-conductive material, such as a liquid crystal polymer or the like, that may be formed using an injection molding process. A probing tip (not shown) is formed from a rigid, non-conductive material, such as fused quartz, fused silica, ceramic material or the like, and is mounted on the pedestal 16. The probing tip has a contoured contact on which is deposited an electrically conductive material, such as gold or the like. The contoured contact has arcuate surfaces forming a substantially rounded contact. The contoured probing tip contact extends past the front surface of the pedestal 16 permitting the contoured probing tip contact to engage test points on a device under test. A substrate (not shown) formed of a non-conductive material, such as FR-4 circuit board material, ceramic material or the like, has a periphery similar in shape to the recessed region 18 and is secured thereon. The probing tip is described in corresponding U.S. patent application Ser. No. 13/149,332, filed May 30, 2011, and titled "Probing Tip for a Signal Acquisition Probe" and incorporated by reference in its entirety.

The support members 14 have an interlocking compliance mechanism 20 with one of the support members 14 having a trapezoidal shaped tab 22 extending outward from the long side 23 of the recessed region 18 parallel to the long axis 15. The other support member 14 has a complimentary trapezoidal shaped recess 24 formed in the recessed region 18 adjacent to the long side 23 parallel to the long axis 15 that receives the trapezoidal shaped tab 22. Each support member 14 is mounted on one of a pair of intermediate carriers 26. The back end 25 of each support member 14 has a threaded aperture formed therein over which a compression spring 28 is positioned. The compression springs 28 are captured between the support members 14 and a transverse wall 30 formed on the intermediate carriers 26. The intermediate carriers 26 are attached to a movable base member 32. The support members 14, intermediate carriers 26, and the base member 32 are mounted on a frame 34. Disposed over the dual probing tip system 10 is a cover 36 having a slot 38 formed therein for receiving a pinion thumb wheel (to be described below) that adjusts the spacing of the probing tips. Semi-circular pockets 40 are formed in the cover 36 that receive coaxial cables coupled to a respective circuit boards mounted on the respective support members 14.

The dual probing tip system 10 provides axial and lateral compliance for each of the support member 14. Each support member 14 has individual lateral compliance of up to 0.010 inches and up to 0.050 inches of axial compliance. The support members 14 have lateral probe tip spacing of up to 0.050 inches. The probing tips move laterally together and apart along an axis perpendicular to the long axis 15 of the support members 14. This is in contrast to prior art movable dual probe tip variable spacing probing systems where the probing tips scribe an arc as they move together and apart.

Figure 2B:
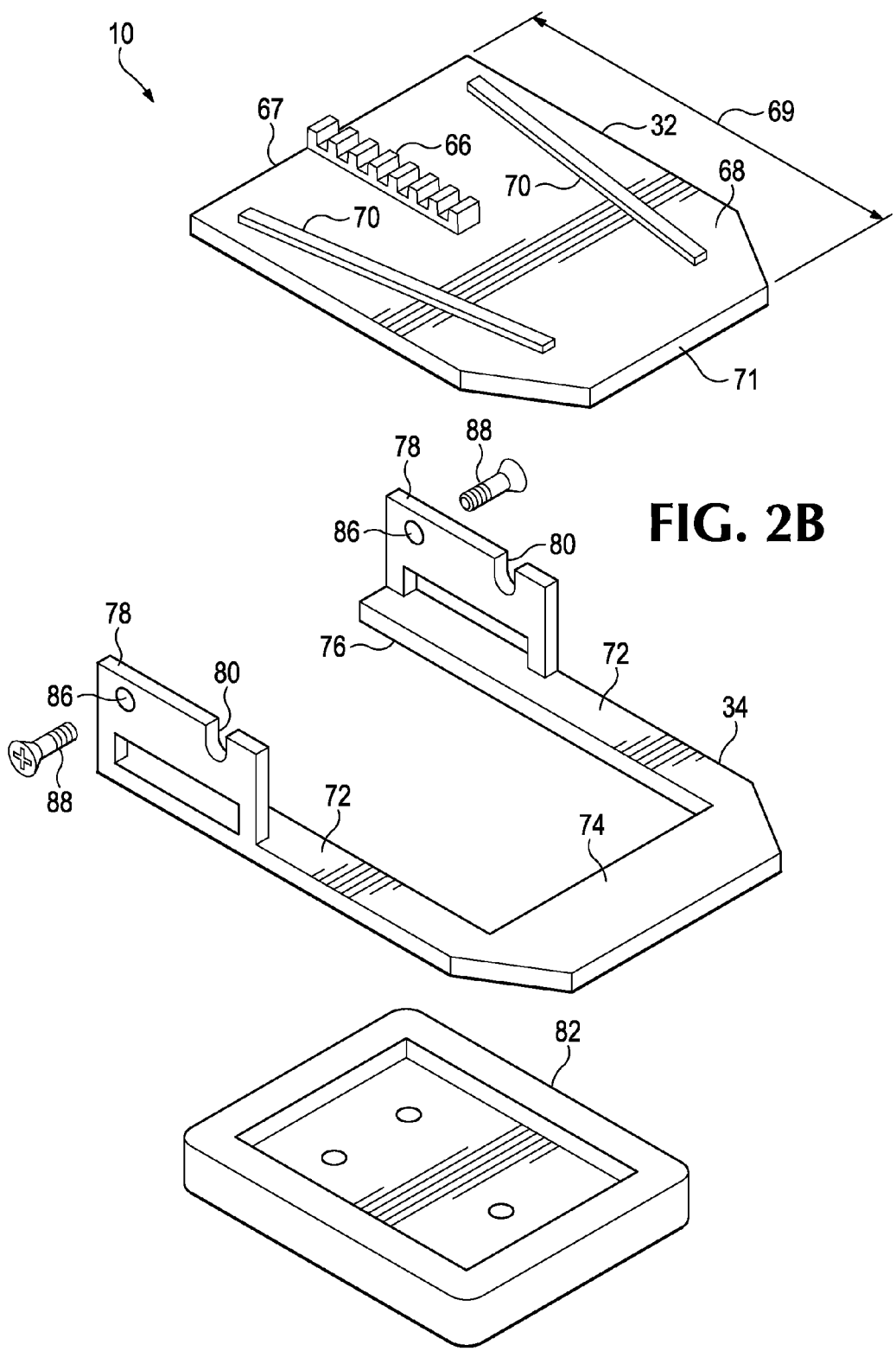

Referring to FIGS. 2A and 2B, there is shown an exploded perspective view of the dual probing tip system 10. Each support member 14 is positioned on a corresponding intermediate carrier 26 having a long axis 27, a bottom surface 29 and a top surface 31. The dual probing tip system 10 uses a slot and rail system to provide variable spacing and lateral and axial compliance of the probing tips on the first and second support members 14. Each support member 14 has a slot 33 formed in the bottom surface 19 thereof parallel to the long axis 15. Each axially aligned slot 33 receives a rail 50 formed on the top surface 31 of each of the respective intermediate carriers 26 parallel to the long axis 27. The slots 33 and the rails 50 are shaped so as to interlock with each other. The slots 33 and rails 50 can have a dovetail shape, a T-slot shape or the like. The back end 52 of each support member 14 abuts one end of one of the corresponding compression spring 28. The other end of the compression spring 28 abut the transverse wall 30 formed on each of the intermediate carriers 26. A mounting element 54, such as a threaded screw, press fit pin or the like, passes through a bore 56 formed in the transverse wall 30 of each of the intermediate carriers 26, through the compression spring 28 and into the aperture in the support member 14, thus securing the support members 14 to the intermediate carriers 26. In the preferred embodiment, the mounting element 54 is a threaded screw and the aperture is a threaded aperture. Axial alignment of the support members 14 is accomplished by the interlocking of the slots 33 and rails 50 of the respective support members 14 and intermediate carriers 26. Axial movement of the support members 14 is accomplished by the relative movement of the slots 33 relative to the rails 50 in the support members 14 and the intermediate carriers 26. Axial pressure applied to the support members 14 compress the compression springs 28 and cause movement of the support members 14 toward the transverse wall 30 of the intermediate carriers 26. Removal of the axial pressure on the support members 14 release the pressure on the compression springs 28 causing the support members 14 to move away from the transverse walls 30 of the intermediate carriers 26.

The interlocking compliance member 20 provides individual variable axial and lateral compliance for each support member 14. At the maximum probe tip spacing resulting from the maximum separation of the first and second support members 14, the interlocking compliance member 20 provides 0.010 inches of lateral movement and 0.050 inches of axial movement for each of the support members 14. As the probe tip spacing is decreased as a result of the separation between the support members 14 decreasing, the trapezoidal tab 22 on one support member 14 moves laterally into the trapezoidal recess 24 of the other support member 14. The decreasing separation between the two trapezoidal members 22, 24 decreases the individual axial compliance of the support members 14 while maintaining overall axial compliance of the probe tip system at 0.050 inches.

A plurality of slotted upright stanchions 58 is disposed at the back end 59 of each of the intermediate carriers 26. Preferably, one stanchion extends from one side surface 61 of the intermediate carrier 26 and the other stanchion extends from the other side surface 63 of the intermediate carrier 26 with the transverse wall 30 disposed toward the front end 65 and connecting the stanchions 58. An axle 62 having a pinion thumb wheel 64 is positioned in slots 60 in the stanchions 58. The teeth of the pinion thumb wheel 64 engage a rack of linear teeth 66 axially disposed on a top surface 68 of the movable base member 32 and extending from the back end 67. Also disposed on the top surface 68 of the movable base member 32 is a pair of rails 70 angularly deposed relative to a long axis 69 that converge toward the front end 71 of the base member 32. Each intermediate carrier 26 has an slot 73 angularly disposed relative to the long axis 27 formed on the bottom surface thereof that interlocks with one of the angled rails 70 on the movable base member 32. As with the slots 33 and rails 50 of the support members 14 and intermediate carriers 26, the slots 73 and rails 70 of the intermediate carriers 26 and the movable base member 32 can have a dovetail shape, a T-slot shape or the like. The movable base member 32 is disposed on frame 34 having side rails 72 extending from a front rail 74. Disposed on the outside of the side rails 72 at the open end 76 of the frame 34 are upright walls 78 having slots 80 extending downward from a top surface. A keeper 82 is positioned beneath the frame 34 and secured to the movable base member 32 using screws or the like to capture the frame 34 between the movable base member 32 and the keeper 82.

The support members 14 are secured to the respective intermediate carriers 26. The support members 14 and their corresponding intermediate carriers 26 are secured to the movable base member 32 via the angled rails 70 of the base member 32 engaging the respective slots 73 in the intermediate carriers 26. The movable base member 32 and hence the intermediate carriers 26 and the support members 14 are secured to the frame 34 by the movable base member keeper 82. The slots 60 of the upright stanchions 58 of the intermediate carriers 26 are aligned with the slots 80 formed in the upright walls 78 of the frame 34. The axle 62 of the pinion thumb wheel 64 is positioned in the slots 60 of the upright stanchions 58 on the intermediate carriers 26 and the slots 80 in the upright walls 78 of the frame 34 with the teeth of the pinion thumb wheel 64 engaging the rack of linear teeth 66 axially disposed on a top surface 68 of the movable base member 32. The cover 36 is positioned over the completed assembly with threaded apertures 84 formed in the cover 36 aligning with holes 86 formed in the upright walls 78. An attachment member, such as threaded screws 88, passes through the holes 86 to secure the cover to the frame 34.

The movement of the base member 32 relative to the intermediate carriers 26 causes the lateral movement of the probing tips of the support members 14. Rotating the pinion thumb wheel 64 clockwise causes the lateral spacing of the probing tips to decrease. The teeth of the pinion thumb wheel 64 engage the rack of linear teeth 66 teeth of the movable base member 32 causing the movable base member 32 to move toward the rear of the dual probing tip system 10. As the movable base member 32 moves toward the rear, the angled rails 70 on the base member 32 move out from the corresponding slots 73 of the intermediate carriers 26 resulting in the closing of the distance between the intermediate carriers 26 and, hence the closing of the distance between the probing tips. Rotating the thumb wheel counterclockwise causes the lateral spacing of the probing tips to increase. The teeth of the pinion thumb wheel 64 engage the rack of linear teeth 66 teeth of the movable base member 32 causing the movable base member 32 to move toward the front of the dual probing tip system 10. As the movable base member 32 moves toward the front, the angled rails 70 on the base member 32 move into the corresponding slots 73 of the intermediate carriers 26 resulting in the opening of the distance between the intermediate carriers 26 and, hence the opening of the distance between the probing tips. Because the intermediate carriers 26 and the support members 14 are fixed relative to the frame 34 by the axle 62 of the pinion thumb wheel 64 engaging the slots 60 and 80 in the respective stanchions 58 of the intermediate carriers 26 and the upright walls 78 of the frame 34, the probing tips of the support members 14 move only in a lateral direction. There is no arcuate movement of the probing tips as the spacing between the probing tips increase and decrease.

It will be obvious to those having skill in the art that many changes may be made to the details of the above-described embodiments of this invention without departing from the underlying principles thereof. The scope of the present invention should, therefore, be determined only by the following claims.

The invention claimed is:

1. A dual probing tip system comprising: a base member movably mounted on a frame with the base member having first and second rails formed on a top surface thereof with the rails angularly disposed toward one end thereof; first and second intermediate carriers with each intermediate carrier having a bottom surface and a top surface with the bottom surface having a slot formed therein angularly disposed toward one end thereof for mating with one of the first and second angularly disposed rails of the base member such that movement of the moveable base member in one direction causes the distance between the first and second intermediate members to close and movement in the other direction causes the distance between the first and second intermediate members to open, wherein the each of the base member and the first and second intermediate carriers has a long axis and a front end and a back end with the rails of the base member angularly disposed relative to the long axis toward the front end thereof and the slots of the first and second intermediate members angularly disposed relative to the long axis toward the front end thereof, wherein each of the first and second intermediate carriers further comprises a rail formed on the top surface thereof parallel to the long axis and first and second support members with each support member having a long axis, bottom surface and a top surface with the bottom surface having a slot formed therein parallel to the long axis for mating with one of the rails on the top surface of one of the first and second intermediate carriers.

2. The dual probing tip system as recited in claim 1 further comprising a keeper attached to the base member and capturing the frame there between.

3. The dual probing tip system as recited in claim 1 wherein each of the first and second support members has a front end and a back end with a probing tip mounted at the front end.

4. The dual probing tip system as recited in claim 3 wherein each of the first and second intermediate carriers further comprises a plurality of spaced apart slotted stanchions disposed at the back end thereof with one slotted stanchion extending from one side surface of the intermediate carrier and another slotted stanchion extending from an opposing side surface of the intermediate carrier with a transverse wall disposed toward the front end and connected to the plurality of slotted stanchions.

5. The dual probing tip system as recited in claim 4 further comprising a thumb wheel having teeth on the outer surface thereof forming a pinion gear disposed on a shaft that is positioned in the slotted stanchions of the first and second intermediate carriers with the teeth of the pinion gear and mating with a linear toothed region disposed on the top surface of the base member that is parallel the long axis of the base member.

6. The dual probing tip system as recited in claim 5 wherein the frame further comprises side rails extending from a front rail with the side rails terminating at an open end, each side rail having an upright wall extending therefrom at the open end and a hole there through for receiving an attachment member that is secured to a cover disposed over the dual probing tip system.

7. The dual probing tip system as recited in claim 6 further comprising a slot formed in each upright wall of the frame extending downward from a top surface that is coextensive with one of the slotted stanchions of the first and second intermediate carriers and receiving the shaft of the pinion gear.

8. The dual probing tip system as recited in claim 6 wherein the attachment member is a threaded screw mating with a threaded bore in the cover.

9. The dual probing tip system as recited in claim 4 wherein each of the first and second support members has an associated compression spring disposed between the back end of the support member and the transverse wall of one of the first and second intermediate carriers with a mounting element passing through a bore in the transverse wall and the compression spring and secured to the support member.

10. The dual probing tip system as recited in claim 9 wherein the mounting element is a threaded screw mating with a threaded aperture in the support member.

11. The dual probing tip system as recited in claim 9 wherein each of the first and second support members has a long side parallel to its long axis with the first and second support member further comprising an interlocking compliance mechanism having a tab extending outward from the long side of one of the first and second support members and a corresponding recess extending inward from the long side of the other of the first and second support members wherein the tab and recess engage each other as the distance between the first and second support members is decreased.

12. The dual probe tip system as recited in claim 11 wherein the tab and recess are trapezoidal in shape.

\* \* \* \* \*